United States Patent
Yamada et al.

(10) Patent No.: US 7,598,549 B2
(45) Date of Patent: Oct. 6, 2009

(54) SEMICONDUCTOR DEVICE HAVING A SILICON LAYER IN A GATE ELECTRODE

(75) Inventors: Satoru Yamada, Tokyo (JP); Ryo Nagai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 416 days.

(21) Appl. No.: 11/299,731

(22) Filed: Dec. 13, 2005

(65) Prior Publication Data

US 2006/0131622 A1 Jun. 22, 2006

(30) Foreign Application Priority Data

Dec. 16, 2004 (JP) ............................. 2004-363999

(51) Int. Cl.
*H01L 29/94* (2006.01)
(52) U.S. Cl. ............... 257/288; 257/335; 257/E29.154
(58) Field of Classification Search ................ 257/288, 257/335, E29.154, E29.255, E21.197, E21.632, 257/E27.061, E27.065
See application file for complete search history.

(56) References Cited

U.S. PATENT DOCUMENTS 5,021,356 A * 6/1991 Henderson et al. .......... 438/294

6,194,259 B1 * 2/2001 Nayak et al. ................ 438/220

FOREIGN PATENT DOCUMENTS

| CN | 1214540 | 4/1999 |
|----|---------|--------|
| JP | 2001-210726 | 8/2001 |
| JP | 2003-31683 | 1/2003 |

OTHER PUBLICATIONS

Chinese Office Action dated Jan. 18, 2008, with partial Japanese and English translation.
Japanese Office Action dated Mar. 27, 2009 with Partial English Translation.

* cited by examiner

*Primary Examiner*—Walter L Lindsay, Jr.
(74) *Attorney, Agent, or Firm*—McGinn IP Law Group, PLLC

(57) ABSTRACT

A CMOS device includes a silicon substrate, a gate insulating film, and a gate electrode including a silicon layer doped with boron and phosphorous, a tungsten nitride layer and a tungsten layer. A ratio of a maximum boron concentration to a minimum boron concentration in a boron concentration profile across the thickness of the silicon layer is not higher than 100. The CMOS device has a lower NBTI (Negative Bias Temperature Instability) degradation.

7 Claims, 8 Drawing Sheets

SEMICONDUCTOR DEVICE HAVING A SILICON LAYER IN A GATE ELECTRODE

BACKGROUND OF THE INVENTION (a) Field of the Invention

The present invention relates to a semiconductor device having a silicon layer in a gate electrode and, more particularly, to a semiconductor device having a gate electrode including a silicon layer doped with boron and lo phosphorous. The present invention also relates to a method for manufacturing such a semiconductor device.

(b) Description of the Related Art

Gate electrodes of a semiconductor device generally include a silicon layer as an undermost conductive layer formed on a gate insulating film. FIG. 1 shows the structure of a gate electrode formed on a silicon substrate in a typical semiconductor device. The semiconductor device, generally designated by numeral 40, includes gate electrodes having a dual polymetal structure. The dual polymetal structure is such that a silicon layer in the gate electrodes of pMOSFETs is doped with p-type impurities, whereas a silicon layer in the gate electrodes of nMOSFETs is doped with n-type impurities.

More specifically, the semiconductor device 40 includes a silicon substrate 11 having a surface area divided into a plurality of pMOS areas 10A and a plurality of nMOS areas 10B by an element isolation region 12 made of silicon oxide ($SiO_2$). The pMOS areas 10A each include an n-well 13 doped with phosphorous in the surface region of the silicon substrate 11, whereas the nMOS areas 10B each include a p-well 14 doped with boron in the surface region of the silicon substrate 11. A gate insulating film 15 is made of silicon oxynitride formed on the surface of the silicon substrate 11. The silicon oxynitride has a function of preventing the boron doped in the p-type gate silicon layer from penetrating therethrough and diffusing toward the silicon substrate 11.

In the pMOS area 10A, the gate electrode 16 of pMOSFET including a 120-nm-thick p-type polysilicon layer 18a, a tungsten nitride (WN) layer 19, and a tungsten layer 20 is formed on the gate insulating film 15. The p-type polysilicon layer 18a is doped with boron at a dosage of $3\times10^{15}$ $cm^{-2}$.

In the nMOS area 10B, the gate electrode 17 of nMOSFET including a 120-nm-thick n-type silicon layer 18b, a tungsten nitride layer 19 and a tungsten layer 20 is formed on the gate insulting film 15. The n-type polysilicon layer 18b is doped with phosphorous at a dosage of $4\times10^{15}$ $cm^{-2}$.

A silicon nitride film ($Si_3N_4$) 21 is formed on the gate electrodes 16, 17, and a silicon nitride sidewall 22 is formed on the wall of the gate electrodes 16, 17 and silicon nitride film 21. Lightly-doped p-type source/drain regions 23 are formed in the surface region of the n-well 13 on both sides of the gate electrode 16, and heavily-doped p-type source/drain regions 25 encircle the lightly-doped p-type source/drain regions 23. Lightly-doped n-type source/drain regions 24 are formed in the surface region of the p-well 14 on both sides of the gate electrode 17, and heavily-doped n-type source/drain regions 26 encircle the lightly-doped p-type source/drain regions 24.

FIGS. 2A to 2D show consecutive steps of a fabrication process for forming a semiconductor device such as shown in FIG. 1. An element isolation region 12 made of a silicon oxide film is formed on a portion of the surface of the silicon substrate 11 for isolation of the pMOS areas and nMOS areas, as shown in FIG. 2A. Subsequently, phosphorous and boron are selectively implanted into the pMOS areas 10A and nMOS areas 10B, respectively, followed by a heat treatment for thermally diffusing implanted phosphorous and boron. This heat treatment activates those dopants to form n-wells 13 and p-wells 14 in the pMOS areas 10A and nMOS areas 10B, respectively. A thin silicon oxynitride film 15a is then deposited to cover the element isolation region 12 and the silicon substrate 11, followed by depositing a 120-nm-thick amorphous silicon layer 31 by using a CVD technique.

Thereafter, as shown in FIG. 2A, boron is implanted into the surface region of the amorphous silicon layer 31 at a dosage of $3\times10^{15}$ $cm^{-2}$, followed by forming a photoresist pattern 32 to cover the pMOS areas 10A and expose the nMOS areas 10B by using a photolithographic technique. Subsequently, as shown in FIG. 2B, phosphorous is implanted into the exposed surface portion of the amorphous silicon layer 31 in the nMOS areas 10B at a dosage of $4\times10^{15}$ $cm^{-2}$. The dosages of the phosphorous and boron are set so that the difference between the dosages per unit thickness of the film is equal to or above $1\times10^{20}$ $cm^{-3}$.

The boron thus implanted allows the portion of the amorphous silicon layer 31 in the pMOS areas 10A to assume a p-type layer. However, the other portion of the amorphous layer 31 in the nMOS areas 10B assumes an n-type layer because the phosphorous is implanted at the dosage higher than the dosage of the boron. This technique simplifies the process for obtaining the p-type and n-type amorphous silicon layers 31 by using a single photolithographic step.

Thereafter, an annealing treatment is performed at a substrate temperature of 950 degrees C. for 20 seconds. This annealing allows the implanted phosphorous and boron to diffuse toward the silicon oxynitride film 15a and also activates those dopants. The annealing also poly-crystallizes the amorphous silicon layer 31, thereby forming a p-type polysilicon layer 18a in the pMOS areas 10A and an n-type polysilicon layer 18b in the nMOS areas 10B. After removing the photoresist pattern 32, a tungsten nitride layer 19 is deposited using a CVD technique. Subsequently, a tungsten layer 20 is deposited by a sputtering technique, followed by forming a silicon nitride film 21 thereon using a CVD technique.

The silicon nitride film 21 is patterned using a photolithographic and etching technique, and used as a hard mask in a dry etching step for patterning the tungsten layer 20, tungsten nitride layer 19, p-type polysilicon layer 18a and n-type polysilicon layer 18b. Thus, the pMOS gate electrodes 16 including the p-type polysilicon layer 18a, tungsten nitride layer 19 and tungsten layer 20, which are consecutively deposited on the silicon oxynitride film 15a, are formed in the pMOS areas 10A. Similarly, the nMOS gate electrodes 17 including the n-type polysilicon layer 18b, tungsten nitride layer 19 and tungsten layer 20, which are consecutively deposited on the silicon oxynitride film 15a, are formed in the nMOS areas 10B. The structure after this step is shown in FIG. 2D.

Thereafter, boron is selectively implanted through the silicon oxynitride film 15a into the surface region of the n-wells 13 in the pMOS areas 10A by using the silicon nitride film 21 in the pMOS areas 10A as a mask. This step provides lightly-doped p-type source/drain regions 23 in the surface region of the n-well 13 on both sides of the gate electrodes 16. Subsequently, phosphorous is selectively implanted through the silicon oxynitride film 15a into the surface region of the p-wells 14 in the nMOS areas 10B by using the silicon nitride film 21 in the nMOS areas 10B as a mask. This step provides lightly-doped n-type source/drain regions 24 in the surface region of the p-well 14 on both sides of the gate electrodes 17.

Thereafter, a silicon nitride film is deposited using a CVD technique, and etched-back to form silicon nitride sidewall films 22 on the side surfaces of the silicon nitride films 21 and the gate electrodes 16, 17. Subsequently, exposed silicon oxynitride film 15a is removed to leave the gate insulating film 15.

Thereafter, boron is selectively implanted in the surface region of the n-wells 13 in the pMOS areas 10A by using the silicon nitride film 21 and sidewall films 22 as a mask. This step provides heavily-doped p-type source/drain regions 25 encircling the lightly-doped p-type source/drain regions 23. Subsequently, phosphorous is selectively implanted in the surface region of the p-wells 14 in the nMOS areas 10B by using the silicon nitride film 21 and sidewall films 22 as a mask. This step provides heavily-doped n-type source/drain regions 26 encircling the lightly-doped n-type source/drain regions 24. Thus, the structure shown in FIG. 1 is obtained. Thereafter, contact plugs, via plugs and interconnects are formed using known processes to complete a DRAM device 40.

The dual-polymetal structure as described above is described in Patent Publication JP-A-2003-31683, for example.

DISCLOSURE OF THE INVENTION (a) Problems to be Solved by the Invention

It is known in the conventional DRAM device 40 as described above that the current driveability of the pMOSFETs is gradually degraded in a phenomenon referred to as negative bias temperature instability (NBTI) degradation. The NBTI degradation is incurred by positive holes induced on the surface of the silicon substrate in the pMOS areas. More specifically, the positive holes induced on the silicon substrate are trapped by nitrogen in the gate insulating film, to change the threshold voltage of the pMOSFETs.

It is known that the NBTI degradation is suppressed by reducing the gate current. FIG. 3 shows the relationship between the index of the NBTI degradation, i.e., the change in the threshold voltage Vt (mV) og the pMOSFETs and the gate current thereof. In this graph, the change in the threshold voltage Vt is plotted against the gate current, after the pMOSFET is operated for 1,000 seconds with the substrate potential Vsub, source potential Vs and drain potential Vd being fixed to zero volt, and the gate potential Vg being set at −4 volts.

In the patterning of the gate electrode, the condition of the dry etching is controlled so as to obtain a gate structure having a round bottom edge for achieving a reduced gate current. The term "bottom edge" of the gate electrode as used herein means the edge of the bottom surface of the gate electrode, and thus the bottom edge is located in the vicinity of the inner edge of the source or drain region of the MOSFET. FIG. 4 shows the relationship between the gate voltage and the gate current including an edge component (curve (i)) flowing at the edge portion of the gate electrode and a central component (curve (ii)) flowing at the central portion of the gate electrode. It will be understood here that the edge component shown by curve (i) accounts for a considerably larger proportion of the gate current compared to the central component shown by curve (ii) for the normal range of the gate voltage between 0 volt and −7.5 volts. The round shape of the bottom edge of the gate electrode employed can alleviate the uneven electric field at the bottom edge of the gate electrode, to thereby reduce the edge component of the gate current, i.e., reduce the larger proportion of the gate current.

In the semiconductor device 40, however, the control of the dry etch conditions does not sufficiently suppress the uneven electric field in an nMOSFET at the bottom edge of the gate electrode, the uneven electric field being caused by the shape of the gate electrode. FIG. 5 shows an electron micrograph of a cross section of the gate electrodes of nMOSFETs in a sample of the typical semiconductor device. This image was obtained after forming a silicon nitride film on the gate electrodes. As understood from this figure, the gate electrodes of the nMOSFETs have a relatively sharp bottom edge. The sharp bottom edge incurs an uneven electric field in the vicinity thereof and increases the gate current at the bottom edge, thereby increasing the total gate current in the CMOS device. The increase of the gate current in the CMOS device accelerates the NBTI degradation of the pMOSFETs.

In view of the above problem of the conventional semiconductor device, it is an object of the present invention to provide a semiconductor device which is capable of suppressing the NBTI degradation of pMOSFETs in a CMOS FETs by alleviating the uneven electric field at the bottom edge of the gate electrodes.

(b) Means for Solving the Problems

The present invention provides, in a first aspect thereof, a semiconductor device including: a semiconductor substrate; a gate insulating film formed on the semiconductor substrate; and a gate electrode including a silicon layer as a bottom layer formed on the gate insulating film, the silicon layer being doped with phosphorous and boron, wherein a ratio of a maximum boron concentration to a minimum boron concentration in a boron concentration profile across a thickness of the silicon layer is not higher than 100.

The present invention provides, in a second aspect thereof, a method for forming a semiconductor device including the consecutive steps of: consecutively depositing a gate insulating film and a silicon layer on a semiconductor substrate; implanting boron into the silicon layer; diffusing the implanted boron by heat-treating the silicon layer; implanting phosphorous into the silicon layer; diffusing at least the implanted phosphorous by heat-treating the silicon layer; and patterning the silicon layer by using a dry etching technique.

The present invention provides, in a third aspect thereof, a method for forming a semiconductor device including the consecutive steps of: consecutively depositing a gate insulating film and a silicon layer on a semiconductor substrate; implanting phosphorous into the silicon layer;

diffusing the implanted phosphorous by heat-treating the silicon layer; implanting boron into the silicon layer;

diffusing at least the implanted boron by heat-treating the silicon layer; and patterning the silicon layer by using a dry etching technique.

In accordance of the semiconductor device of the present invention, the configuration, wherein the ratio of the maximum boron concentration to the minimum boron concentration in the boron concentration profile across the thickness of the silicon layer is not higher than 100, suppresses the sharp bottom edge of the gate electrode and thus suppresses the increase in the gate current of the nMOSFETs, whereby the NBTI degradation in the pMOSFETs can be suppressed.

In accordance with the method of the first aspect of the present invention, since the boron is diffused in the silicon layer without the presence of phosphorous, the boron can be sufficiently diffused, without an obstacle by the phosphorous. Thus, the boron concentration is uniform in the boron concentration profile across the thickness of the silicon layer. This suppresses the sharp bottom edge of the silicon layer to reduce the gate current.

In accordance with the method of the second aspect of the present invention, since the phosphorous is first diffused and then the boron is diffused at the lower phosphorous concentration, the boron can be sufficiently diffused without an obstacle by the phosphorous. Thus, the boron concentration is uniform in the boron concentration profile across the thickness of the silicon layer. This suppresses the sharp bottom edge of the silicon layer to reduce the gate current.

The above and other objects, features and advantages of the present invention will be more apparent from the following description, referring to the accompanying drawings.

PREFERRED EMBODIMENT OF THE INVENTION

Before describing the embodiment of the present invention, the principle of the present invention will be described for a better understanding of the present invention. The present inventor conducted a study on the cause of the sharp bottom edge of the gate electrodes of nMOSFETs, which incurs an increase in the gate current of the CMOS device. The study revealed that a heat treatment applied to the silicon layer including the mixture of inactive boron and inactive phosphorous as the dopants did not well diffuse the boron because the phosphorous suppressed the diffusion of boron. Accordingly, the n-type polysilicon layer 18b, in which impurities of phosphorous and boron coexist, has a large variation of the boron concentration in the boron concentration profile across the thickness of the polysilicon layer 18b. Thus, the boron concentration is lower in the vicinity of the bottom surface of the n-type polysilicon layer 18b in the conventional semiconductor device.

Figure 5:
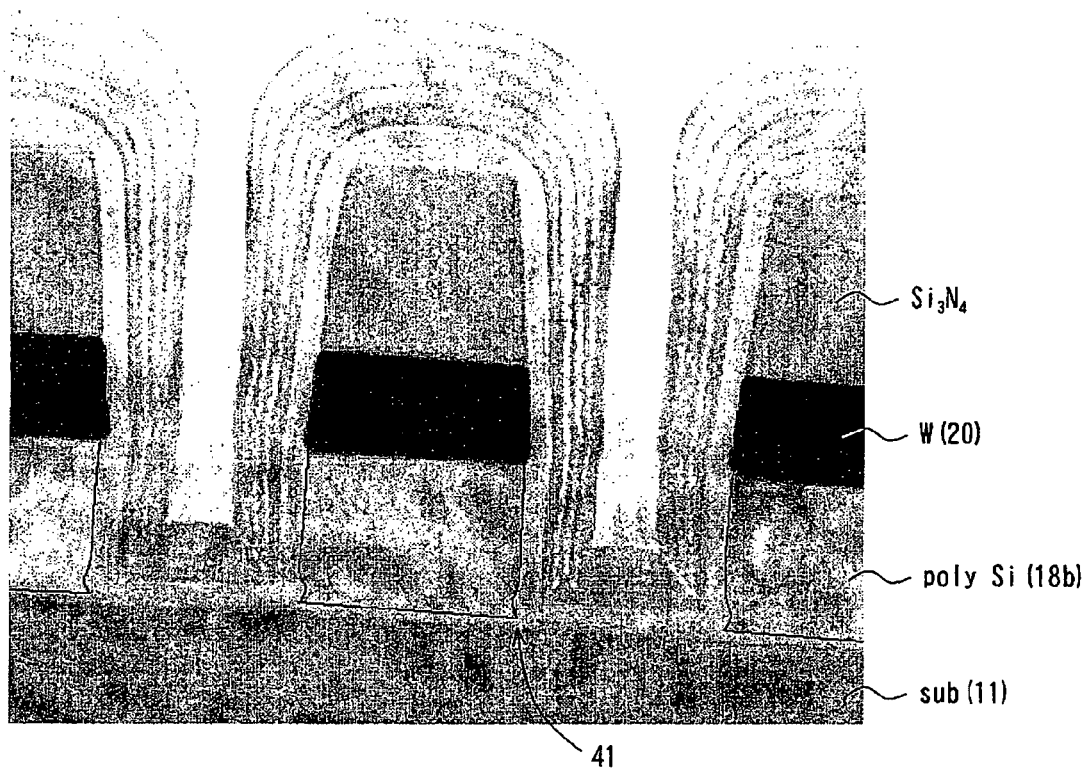
FIG. 5 is an electron micrograph of gate electrodes in the cross section thereof in a sample of the semiconductor device of FIG. 1.
Figure 6:
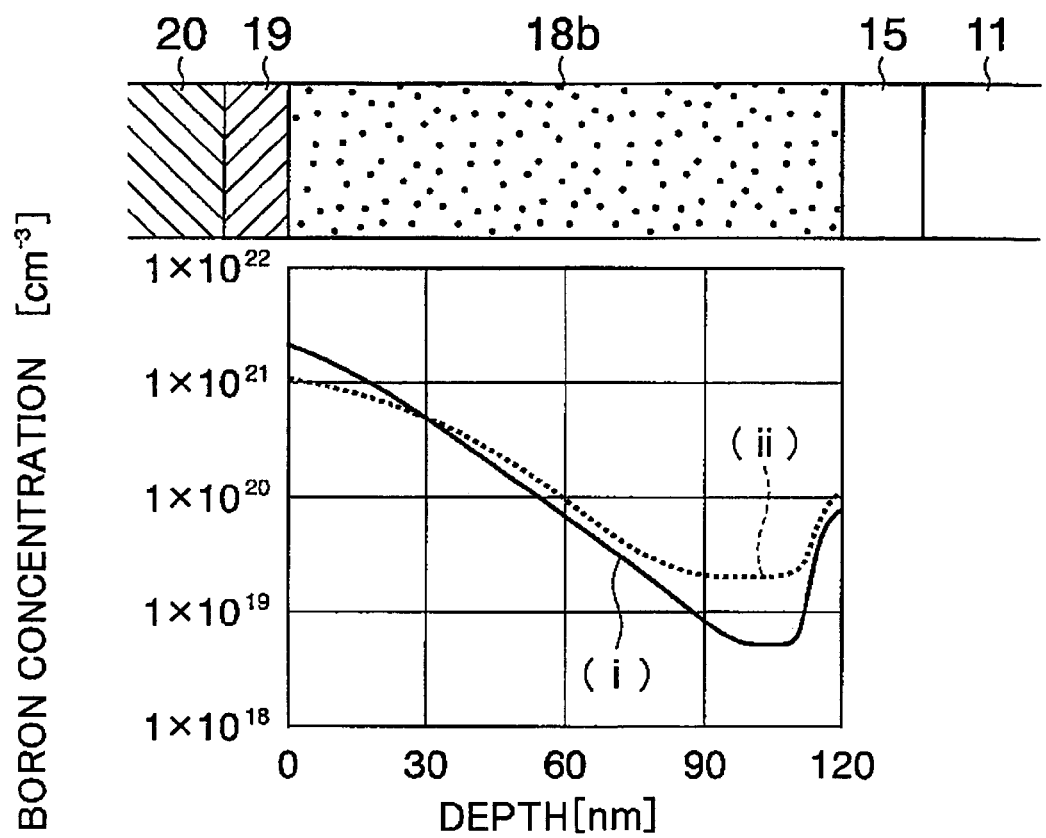
FIG. 6 is graph showing a boron concentration profile across the thickness of an n-type polysilicon layer.

FIG. 6 shows the boron concentration profile, which is denoted by (i) therein, measured across the thickness of the n-type polysilicon layer 18b in the sample shown in FIG. 5. FIG. 6 additionally shows the layered structure including semiconductor substrate 11 and layered films 12 to 20 shown in FIG. 1, with the thickness direction thereof being depicted in the horizontal direction in the figure, for a better understanding of the boron concentration profile (i) with respect to the thickness plotted on the abscissa.

In FIG. 6, the boron concentration monotonically reduces from the top surface toward the bottom surface of the n-type polysilicon layer 18b, assumes a minimum value at the depth of around 100 nm measured from the top surface, and then increases in the vicinity of the bottom surface, i.e., in the vicinity of the oxynitride film 15a. The ratio of the maximum boron concentration to the minimum boron concentration in the boron concentration profile (i) of the n-type polysilicon layer 18b is around 300, as will be understood from FIG. 6. The increase in the boron concentration in the vicinity of the oxynitride film 15a is peculiar to the boron. The reason of this increase is that boron is subjected to redistribution by a heat treatment to be easily precipitated or separated on the surface of the silicon oxynitride film 15a.

Figure 7:
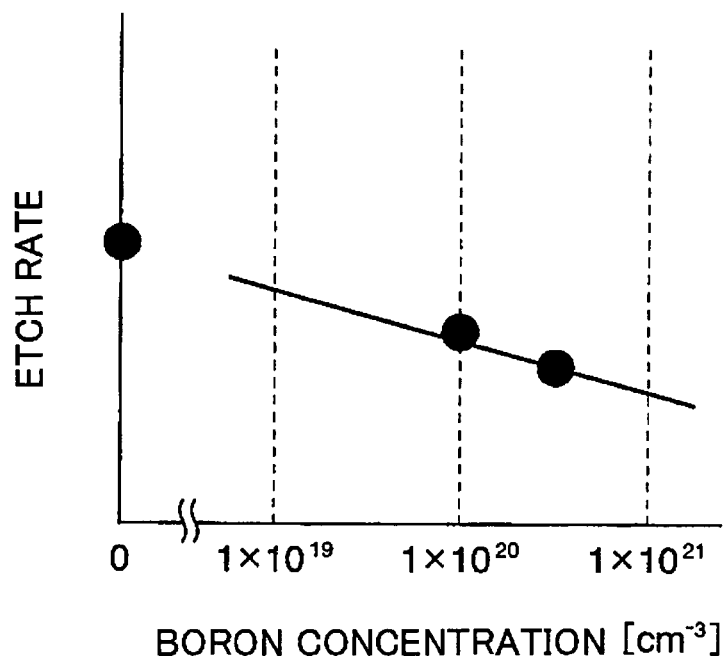
FIG. 7 is a graph showing the relationship between the etch rate of the n-type polysilicon layer and the boron concentration thereof.

It is generally known that the dry etching of polysilicon doped with impurities encounters variation in the etch rate depending on the concentration of the impurities. FIG. 7 exemplifies the relationship between the boron concentration of the polysilicon and the etch rate thereof in a dry etching step using a mixture of $Cl_2$, HBr and $O_2$. A higher boron concentration reduces the etch rate of the polysilicon. The data shown in FIG. 5 is that reported on a society by F. H. Bell (JVST B15, 88, 1997).

Figure 8:
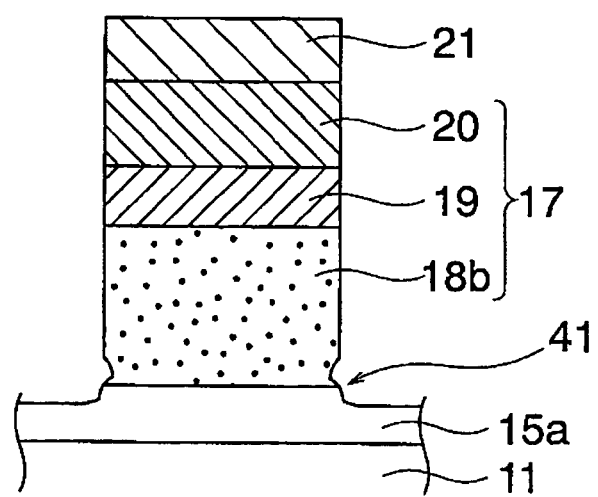
FIG. 8 is a sectional view schematically showing the defect in the bottom edge of the gate electrode in a conventional semiconductor device.

Thus, the shape of the side surfaces of the polysilicon layer 18b after the dry etching thereof is such that a portion having a higher boron concentration has a larger width due to a lower etch rate, whereas another portion having a lower boron concentration has a smaller width due to a higher etch rate. Considering this fact with reference to the boron concentration profile (i) of FIG. 6, the polysilicon layer 18b will have a width profile such that the width gradually reduces from the top surface having a larger boron concentration to the depth of around 100 nm having a minimum boron concentration, and then increases toward the interface between the polysilicon layer 18b and the silicon oxynitride film 15. Thus, the resultant structure will be such as shown in FIG. 8, wherein the vicinity of the bottom surface of the n-type polysilicon layer 18b has a minimum width and then increases toward the bottom surface, resulting in a sharp bottom edge 41 of the n-type polysilicon layer 18b.

In view of the above analysis, the present invention employs a measure for suppressing occurrence of the sharp bottom edge by reducing the variation in the boron concentration profile across the thickness of the n-type polysilicon layer 18b, thereby suppressing the increase in the gate current in the CMOS device.

For reducing the variation in the boron concentration profile across the thickness of the n-type polysilicon layer, an additional anneal treatment is performed prior to the implanting of phosphorous. The absence of the phosphorous in the silicon layer allows the boron to sufficiently diffuse toward the bottom surface of the silicon layer during the additional annealing. In an alternative, boron is implanted after the implanting and annealing of phosphorous are performed after each of the implanting of boron and phosphorous. In the latter case, the first annealing well diffuses the implanted phosphorous to reduce the local phosphorous concentration, whereby the boron implanted after the reduction of the local phosphorous concentration can be well diffused toward the bottom surface. By using such a technique, the increase of the gate current can be suppressed to thereby achieve suppression of the NBTI degradation.

Figure 9:
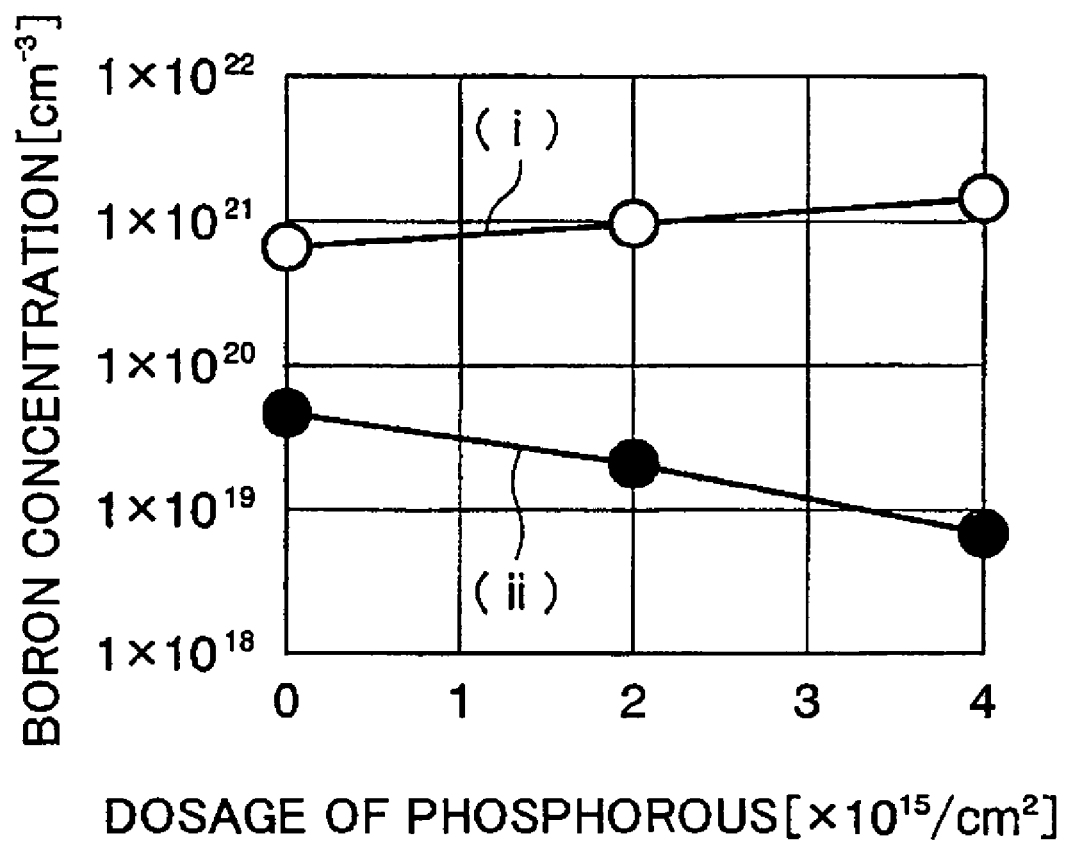
FIG. 9 is a graph showing the relationship between the boron concentration and the dosage of phosphorous in the n-type polysilicon layer.
Figure 1:
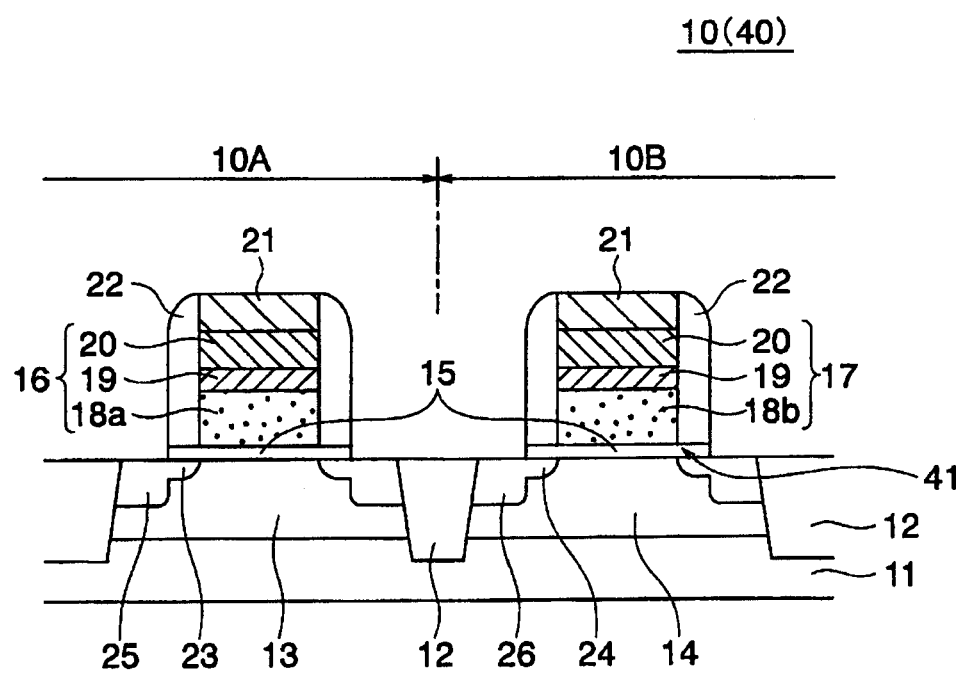

The present inventor conducted experiments for investigating the shape of the bottom edge of the gate electrodes of the nMOSFETs as well as the maximum boron concentration and the minimum boron concentration in the boron concentration profile across the thickness of the n-type polysilicon layer 18b, with the dosage of phosphorous being stepwise changed within the range between 0 and $4 \times 10^{15}$ $cm^{-2}$. FIG. 9 shows the results of the experiments, wherein curves (i) and (ii) represent the maximum boron concentration and minimum boron concentration, respectively. In FIG. 9, a higher dosage of phosphorous incurs a larger ratio for the lo maximum boron concentration to the minimum boron concentration in the n-type silicon layer. For example, dosages of $2\times10^{15}$ cm$^{-2}$ and $4\times10^{15}$ cm$^{-2}$ provide the ratios of lower than 100 and higher than 100, and the ratio assumes around 80 without doping of phosphorous.

The results of the experiments shown in FIG. 9 revealed that 100 or below for the ratio of the maximum to minimum of the boron concentration is provided by a dosage of $2\times10^{15}$ cm$^{-2}$ for the phosphorous, and prevented occurring of a sharp bottom edge of the gate electrodes. On the other hand, a ratio above 100 is provided by a dosage of $4\times10^{15}$ cm$^{-2}$ for phosphorous, for example, and incurred a sharp bottom edge of the gate electrodes. Thus, the present invention employs 100 or below for the ratio of the maximum to the minimum in the boron concentration profile across the thickness of the n-type silicon layer, for suppression of the increase in the gate current in the CMOS device.

It is preferable in the above configuration of the present invention that a difference between a dosage of phosphorous per unit thickness and a dosage of boron per unit thickness in the n-type silicon layer be not lower than $1\times10^{20}$ cm$^{-3}$. This allows the polysilicon layer to assume a suitable n-type layer.

It is also preferable that boron diffusing step as well as the phosphorous diffusing step be conducted at a temperature of not lower than 900 degrees C.

Now, the present invention is more specifically described with reference to the preferred embodiment thereof. The structure of a semiconductor device according to an embodiment of the present invention is similar to the structure of the typical semiconductor device 40 of FIG. 1 except for the structure of the bottom edge of the gate electrodes.

Figure 1:
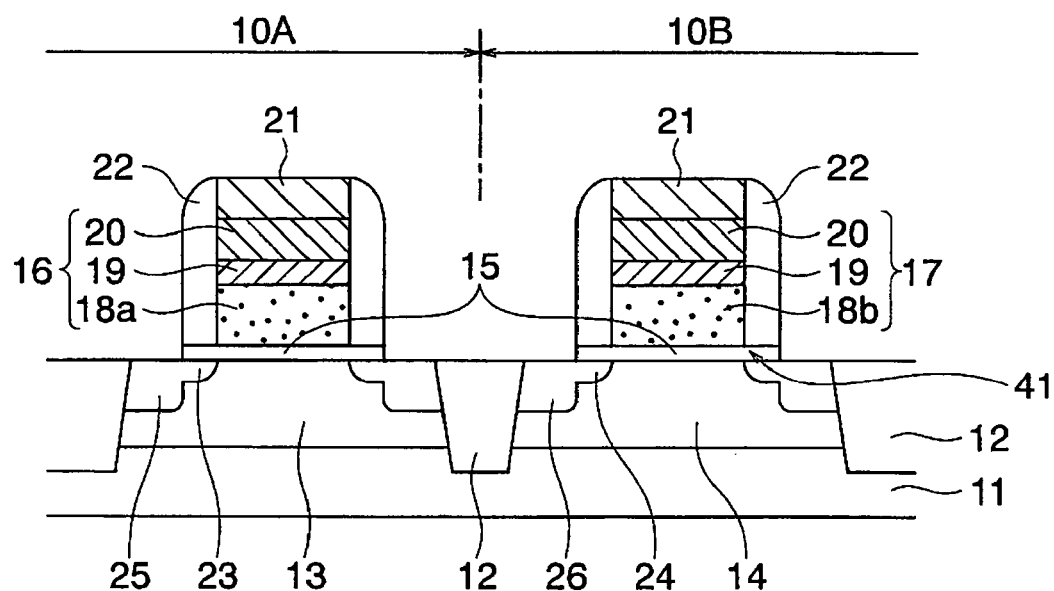
FIG. 1 is a sectional view of a typical semiconductor device.

More specifically, in FIG. 1, the semiconductor device 10 of the present embodiment is configured as a CMOS device, and includes a silicon substrate 11, on which an element isolation region 12 made of silicon oxide isolates pMOS areas 10A and nMOS areas 10B from one another. On the surface region of the silicon substrate 11 in each of the pMOS areas 10A and each of the nMOS areas 10B are formed an n-well 13 doped with phosphorous and a p-well 14 doped with boron, respectively. A gate insulating film 15 made of thin silicon oxynitride is formed on the silicon substrate 11 in the pMOS areas 10A and nMOS areas 10B.

In the pMOS area 10A, a 120-nm-thick p-type polysilicon layer 18a, tungsten nitride layer 19 and tungsten layer 20 are consecutively deposited on the gate insulating film 15 to form a gate electrode 16 of a pMOSFET. The p-type polysilicon layer 18a is doped with boron at a dosage of $3\times10^{15}$ cm$^{-2}$.

In the nMOS area 10B, a 120-nm-thick n-type polysilicon layer 18b, tungsten nitride layer 19 and tungsten layer 20 are consecutively deposited on the gate insulating film 15 to form a gate electrode 17 of an nMOSFET. The n-type polysilicon layer 18b is doped with boron at a dosage of $3\times10^{15}$ cm$^{-2}$ and phosphorous at a dosage of $4\times10^{15}$ cm$^{-2}$. The boron concentration in the n-type polysilicon layer 18b is such that the ratio of the maximum boron concentration to the minimum boron concentration is as low as around 80 in the boron concentration profile across the thickness thereof. The gate electrode has a round bottom edge 41 in the vicinity of each of the source/drain regions 26.

A silicon nitride film 21 is formed on the gate electrodes 16, 17, on which sidewall films 22 are formed at the side surfaces thereof. The surface region of the n-well 13 is provided with lightly-doped p-type source/drain regions 23 which sandwich therebetween the gate electrode 16 as viewed in the vertical direction. The lightly-doped p-type source/drain regions 23 are encircled by respective heavily-doped p-type source/drain regions 25. The surface region of the p-well 14 is provided with lightly-doped n-type source/drain regions 24 which sandwich therebetween the gate electrode 17 as viewed in the vertical direction. The lightly-doped n-type source/drain regions 24 are encircled by respective heavily-doped n-type source/drain regions 26.

The structure of the gate electrodes having a round bottom edge 41 in the nMOSFETs suppresses the gate current in the CMOS device, to thereby suppress the NBTI degradation in the pMOSFETs.

A semiconductor device according to the present embodiment is manufactured by the process as detailed below with reference to FIGS. 2A to 2D.

First, an element isolation region 12 is formed on the surface of a silicon substrate 11 to isolate pMOS areas 10A and nMOS areas 19B from one another. The pMOS areas 10A and nMOS areas 10B are selectively doped with phosphorous and boron, respectively. Subsequently, a heat treatment is conducted to diffuse the implanted phosphorous and boron and activate those dopants to form n-wells 13 and p-wells 14 in the pMOS areas 10A and nMOS areas 10B, respectively. A thin silicon oxynitride film 15a is then deposited to cover the element isolation region 12 on the silicon substrate 11, followed by depositing a 120-nm-thick amorphous silicon layer 31 by using a CVD technique.

Figure 2A:
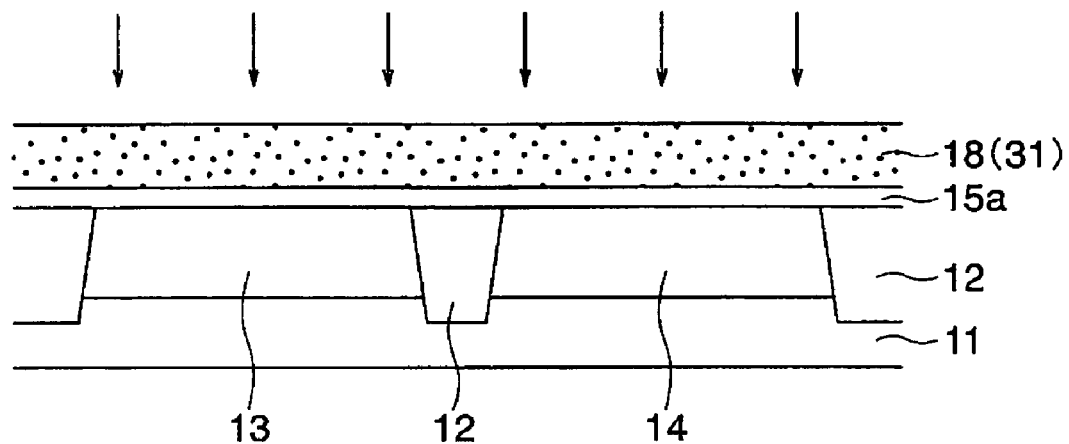
FIGS. 2A to 2D are sectional views consecutively showing steps of a fabrication process for a semiconductor device such as shown in FIG. 1.

Thereafter, a shown in FIG. 2A, boron is implanted into the surface region of the amorphous silicon layer 31 at a dosage of $3\times10^{15}$ cm$^{-2}$, followed by performing a first anneal treatment at a substrate temperature of 950 degrees C. for around for 10 seconds to diffuse the implanted boron toward the vicinity of the silicon oxynitride film 15a and activate the same. The first anneal treatment also poly-crystallizes the lo amorphous silicon layer 31 to form a polysilicon layer 18.

Figure 2B:
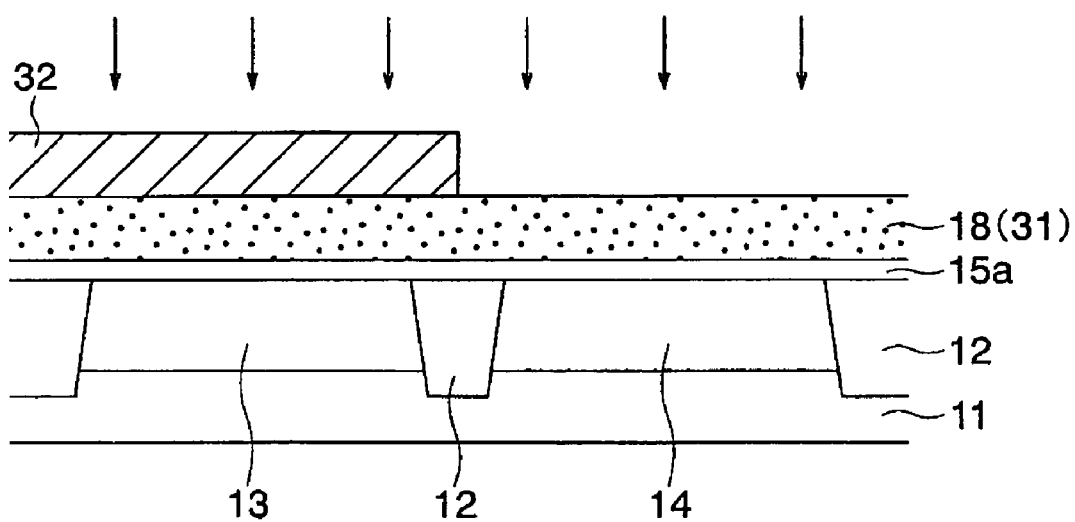

A resist pattern 32 is then formed using a photolithographic technique to cover the pMOS areas 10A and expose nMOS areas 10B, followed by selectively implanting phosphorous into the exposed surface region of the nMOS areas 10B at a dosage of $4\times10^{15}$ cm$^{-2}$, as shown in FIG. 2B. The polysilicon layer 18 in the pMOS areas 10A assumes a p-type layer due to the implantation of boron, whereas the polysilicon layer 18 in the nMOS areas 10B assumes an n-type layer due to the implantation of phosphorous at a dosage higher than the dosage of the implantation of boron.

Figure 2C:
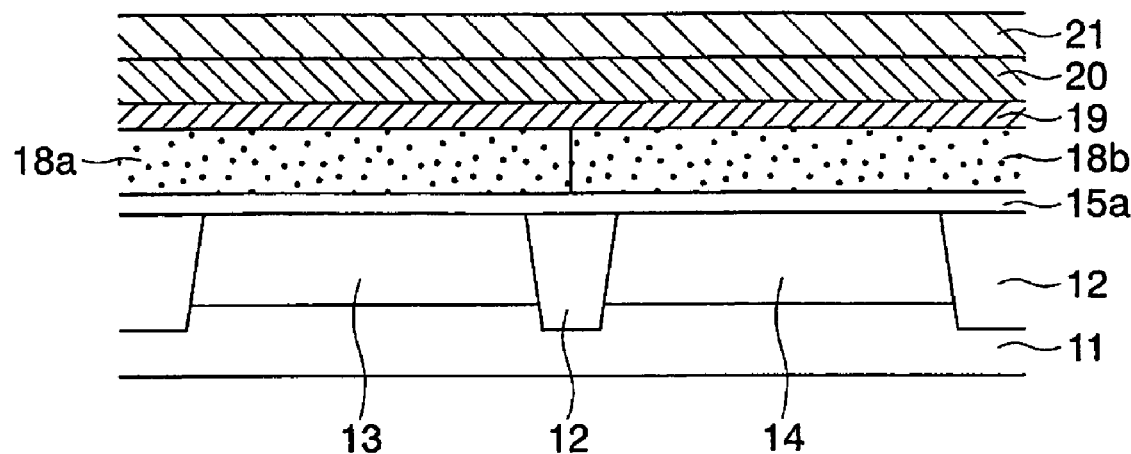

Thereafter, a second anneal treatment is conducted at a substrate temperature of 950 degrees C. for around 20 seconds. The second anneal treatment diffuses the implanted phosphorous toward the vicinity of the silicon oxynitride film 15a and activates the implanted phosphorous. The boron diffused prior to the second anneal treatment is further diffused by the second anneal treatment. Thus, the p-type polysilicon layer 18a and n-type polysilicon layer 18b are formed in the pMOS area 10A and nMOS areas 10B, respectively. After removing the photoresist pattern 32, a tungsten nitride layer 19 is deposited by using a CVD technique. Subsequently, a tungsten layer 20 is deposited thereon by using a sputtering technique, followed by lo depositing a silicon nitride film 21 thereon by using a CVD technique, as shown in FIG. 2C.

Figure 2D:
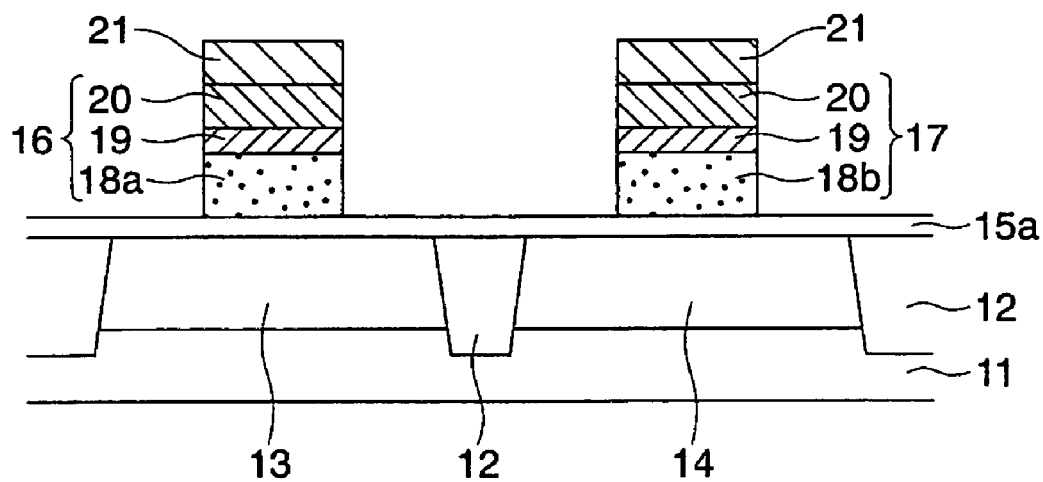
Figure 3:
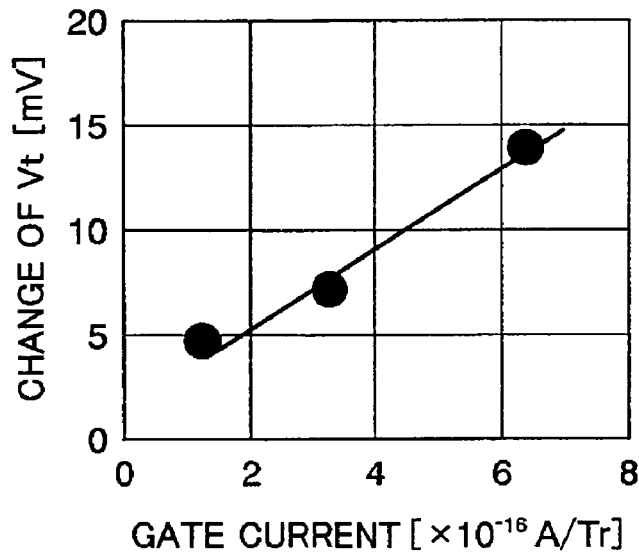
FIG. 3 is a graph showing the relationship between the change in the threshold voltage of an nMOSFET and the gate current.
Figure 4:
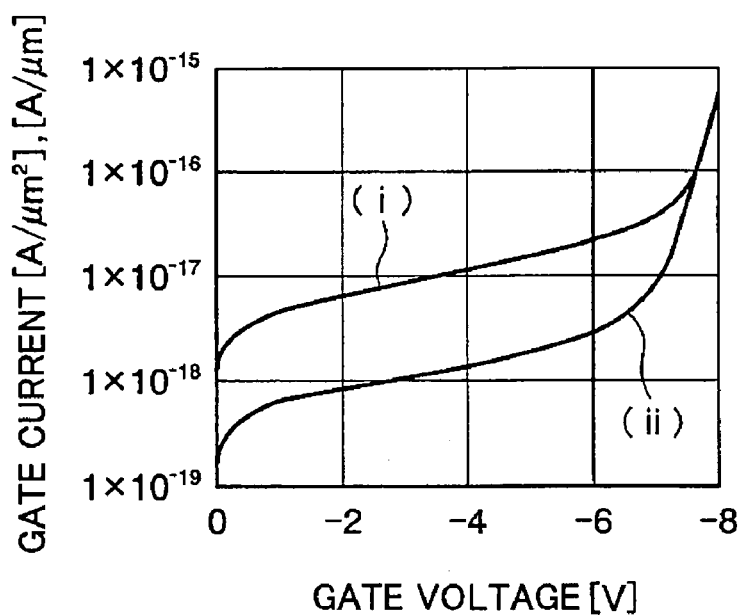
FIG. 4 is a graph showing the relationship between the gate current including edge and central components and the gate voltage in the nMOSFET.

The silicon nitride film 21 is then patterned by using a photolithographic and etching technique, and is used as a mask in a dry etching for patterning the tungsten layer 20, tungsten nitride layer 19 and p-type and n-type polysilicon layers 18a, 18b. Thus, the gate electrodes 16 of pMOSFETs including p-type polysilicon layer 18a, tungsten nitride layer 19 and tungsten layer 20 and the gate electrodes 17 of nMOS- FETs including n-type polysilicon layer 18b, tungsten nitride layer 19 and tungsten layer 20 are formed in the pMOS areas 10A and nMOS areas 10B, respectively, as shown in FIG. 2D.

Thereafter, boron is selectively implanted through the silicon oxynitride film 15a into the surface region of the n-wells 13 of the pMOS areas 10A by using the gate electrode 16 as a mask. Thus, lightly-doped p-type source/drain regions 23 are formed on the surface region of the n-wells 13 to sandwich therebetween the gate electrodes 16 as viewed normal to the substrate surface. Subsequently, phosphorous is selectively implanted through the silicon oxynitride film 15a into the surface region of the p-wells 14 of the nMOS areas 10B by using the gate electrodes 17 as a mask. Thus, lightly-doped n-type source/drain regions 24 are formed on the surface region of the p-wells 14 to sandwich therebetween the gate electrodes 17 as viewed normal to the substrate surface.

Thereafter, a silicon nitride film is deposited using a CVD technique, and is etched back to form silicon nitride sidewall films 22 on the side surfaces of the gate electrodes 16, 17. Subsequently, exposed portion of the silicon oxynitride film 15a is removed to leave the gate insulating film 15.

Thereafter, boron is selectively implanted in the surface region of the n-wells 13 by using the silicon nitride film 21 and the sidewall films 22 as a mask, whereby heavily-doped p-type source/drain regions 25 are formed to encircle the lightly-doped p-type source/drain regions 23. Subsequently, phosphorous is selectively implanted in the surface region of the p-wells 14 by using the silicon nitride film 21 and the sidewall films 22 as a mask, whereby heavily-doped n-type source/drain regions 26 are formed to encircle the lightly-doped n-type source/drain regions 24. Thus, the structure shown in FIG. 1 is obtained. Thereafter, known processes are conducted to form contact plugs, via-plugs, interconnects etc. to obtain a DRAM device as a semiconductor device according to the present embodiment.

In accordance with the method of the present embodiment, the first anneal treatment conducted prior to the phosphorous implantation allows the boron implanted into the lo surface region of the amorphous silicon layer 31 in the nMOS areas 10B to diffuse in the thickness direction of the amorphous silicon layer 31. Thus, variation of the boron concentration in the boron concentration profile across the thickness of the n-type polysilicon layer 18b can be reduced, whereby the resultant gate electrodes 17 have a round bottom edge. This reduces the gate current in the CMOS device and thus suppresses the NBTI degradation.

Samples of the semiconductor device of the present embodiment were manufactured, and subjected to measurement of the boron concentration profile in the n-type polysilicon layer 18b. The result is shown by curve (ii) in FIG. 6. As understood from the same drawing, the samples of the semiconductor device exhibited a boron concentration profile (ii) which has a lower maximum boron concentration and a considerably higher minimum boron concentration compared to those of curve (i). Thus, the variation of the boron concentration is reduced in the samples of the semiconductor device according to the present embodiment compared to the conventional semiconductor device. The ratio of the maximum to the minimum of the boron concentration in the samples exhibited around 80, which is roughly equal to the corresponding ratio in the n-type polysilicon layer without doping of phosphorous, such as shown in FIG. 9.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising:
   a semiconductor substrate;
   a gate insulating film formed on said semiconductor substrate; and
   a gate electrode including a silicon layer as a bottom layer formed on said gate insulating film, said silicon layer being doped with phosphorous and boron,
   wherein a ratio of a maximum boron concentration to a minimum boron concentration in a boron concentration profile across a thickness of said silicon layer is not higher than 100, and
   wherein said gate electrode has a round bottom edge.

2. The semiconductor device according to claim 1, wherein said silicon layer is of an n-type, and
   wherein a difference in said silicon layer between a dosage of phosphorous per unit thickness and a dosage of boron per unit thickness is not less than $1 \times 10^{20}$ cm$^{-3}$.

3. The semiconductor device according to claim 1, wherein said semiconductor device includes complementary metal-oxide-semiconductor field effect transistors (CMOS FETs).

4. The semiconductor device according to claim 1, wherein said silicon layer comprises a dosage of the phosphorous equal to or less than $3 \times 10^{15}$ cm$^{-2}$.

5. The semiconductor device according to claim 1, wherein said ratio of said maximum boron concentration to said minimum boron concentration in said boron concentration profile across said thickness of said silicon layer is not less than 80.

6. The semiconductor device according to claim 1, wherein said ratio of said maximum boron concentration to said minimum boron concentration in said boron concentration profile across said thickness of said silicon layer is characteristic of a ratio of a maximum boron concentration to a minimum boron concentration in a boron concentration profile across a thickness of an n-polysilicon layer without a doping of the phosphorous.

7. The semiconductor device according to claim 1, wherein a boron concentration is uniform in said boron concentration profile across said thickness of said silicon layer.

* * * * *

UNITED STATES PATENT AND TRADEMARK OFFICE
CERTIFICATE OF CORRECTION

| | |
|---|---|
| PATENT NO. | : 7,598,549 B2 |
| APPLICATION NO. | : 11/299731 |
| DATED | : October 6, 2009 |
| INVENTOR(S) | : Satoru Yamada et al. |

It is certified that error appears in the above-identified patent and that said Letters Patent is hereby corrected as shown below:

In Figure 1, delete "Prior Art". Attached page.

Signed and Sealed this
Eighth Day of February, 2011

David J. Kappos
*Director of the United States Patent and Trademark Office*